(12) United States Patent
Yoshida et al.

(10) Patent No.: US 11,315,823 B2
(45) Date of Patent: Apr. 26, 2022

(54) SUBSTRATE SUCTION-HOLDING STRUCTURE AND SUBSTRATE TRANSFER ROBOT

(71) Applicants: KAWASAKI JUKOGYO KABUSHIKI KAISHA, Kobe (JP); KAWASAKI ROBOTICS (USA), INC., Wixom, MI (US)

(72) Inventors: Masaya Yoshida, Himeji (JP); Hajime Nakahara, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 153 days.

(21) Appl. No.: 16/728,541

(22) Filed: Dec. 27, 2019

(65) Prior Publication Data
US 2021/0202291 A1    Jul. 1, 2021

(51) Int. Cl.
*H01L 21/68* (2006.01)
*H01L 21/683* (2006.01)
(Continued)

(52) U.S. Cl.
CPC ...... *H01L 21/6838* (2013.01); *B25J 15/0683* (2013.01); *H01L 21/68707* (2013.01)

(58) Field of Classification Search
None
See application file for complete search history.

(56) References Cited

U.S. PATENT DOCUMENTS 7,044,521 B2 *  5/2006  Tokunaga ............ B25J 15/0616
                                                              294/183
7,055,875 B2 *  6/2006  Bonora ................ H01L 21/6838
                                                              294/188
(Continued)

FOREIGN PATENT DOCUMENTS

CN      104275702 A      1/2015
JP      2004-186355 A    7/2004
(Continued)

OTHER PUBLICATIONS

Kyocera Global, "Technical Data, Alumina (Aluminum Oxide, Al2O3)," https://global.kyocera.com/prdct/fc/list/material/alumina/alumina.html, accessed Mar. 23, 2022 (Year: 2013).*

*Primary Examiner* — Gerald McClain
(74) *Attorney, Agent, or Firm* — Oliff PLC

(57) ABSTRACT

A substrate suction-holding structure includes a conductive pad main body including an annular contact portion and a bottom wall portion closing a first vacuum chamber bottom surface surrounded by the contact portion, a conductive blade main body including an upper surface and a second vacuum chamber formed by depressing the upper surface, a conductive support column provided either on the second vacuum chamber or on the pad main body, causing the contact portion to be further on an upper side than the upper surface, and swingably supporting the pad main body with respect to the second vacuum chamber, a cover secured to the blade main body and covering the second vacuum chamber, and a suction path extending from the first vacuum chamber and passing through the bottom wall portion, the second vacuum chamber, and the blade main body in this order, the suction path connected to a vacuum source.

14 Claims, 7 Drawing Sheets

(51) Int. Cl.
 *B25J 15/06* (2006.01)
 *H01L 21/687* (2006.01)

(56) References Cited

U.S. PATENT DOCUMENTS

| 2015/0008689 | A1  |   | 1/2015 | Shin et al. |            |
|--------------|-----|---|--------|-------------|------------|
| 2016/0243707 | A1  | * | 8/2016 | Matsuhira   | B25J 15/0014 |
| 2020/0048014 | A1  | * | 2/2020 | Nakayama    | B25J 15/0683 |

FOREIGN PATENT DOCUMENTS

| JP | 2011-29388  | A |   | 2/2011 |
|----|-------------|---|---|--------|
| JP | 2011029388  | A | * | 2/2011 |
| TW | 201631691   | A |   | 9/2016 |

\* cited by examiner

[FIG. 1]
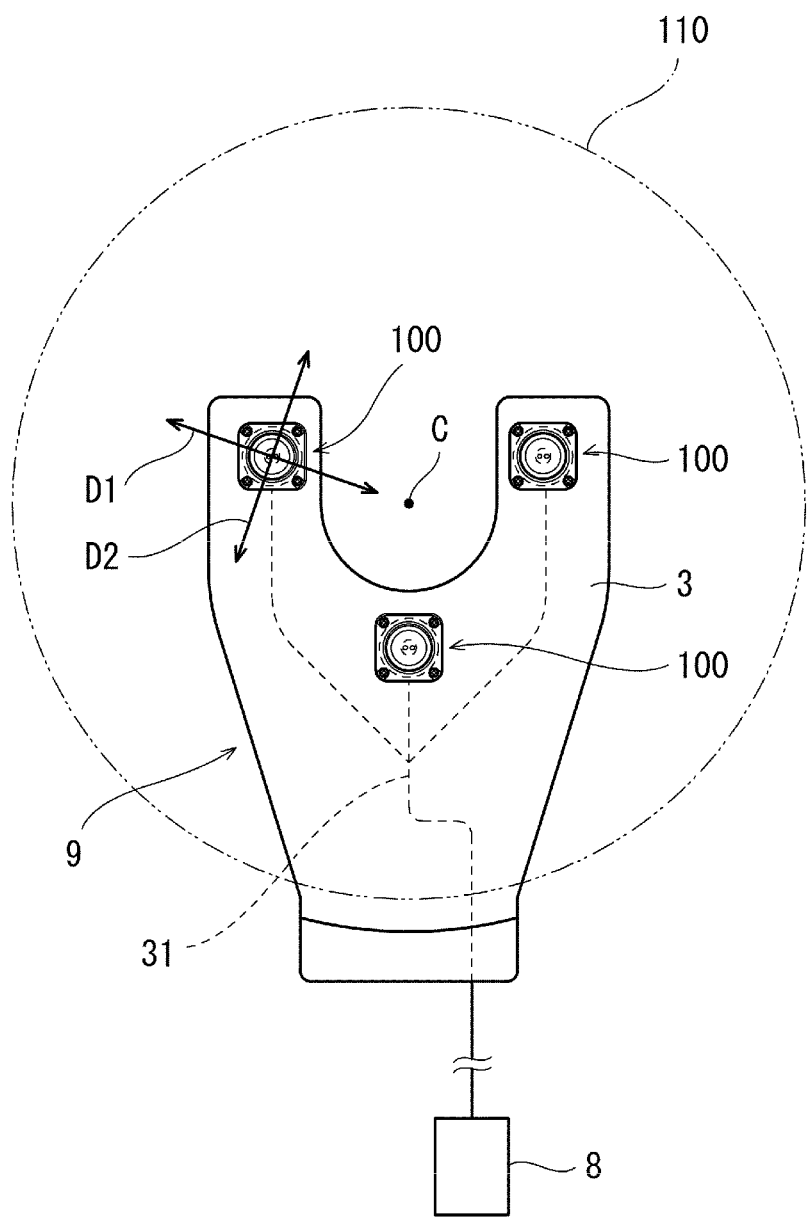

[FIG. 2]
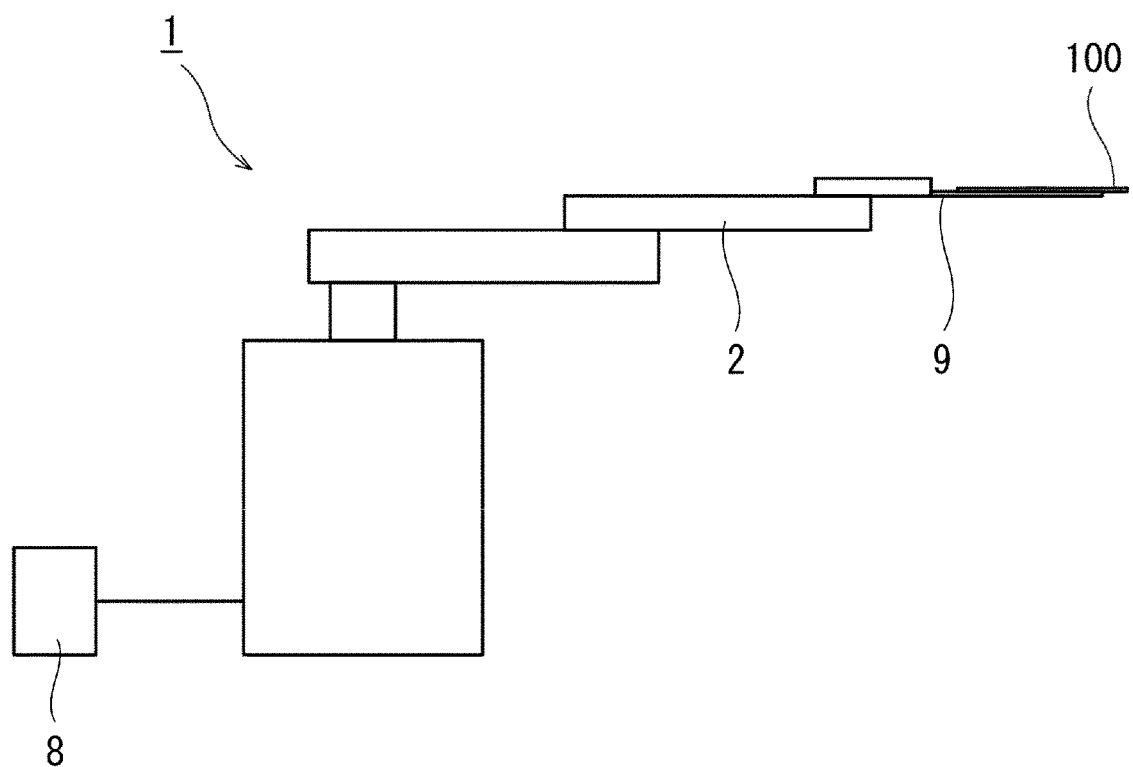
[FIG. 3]
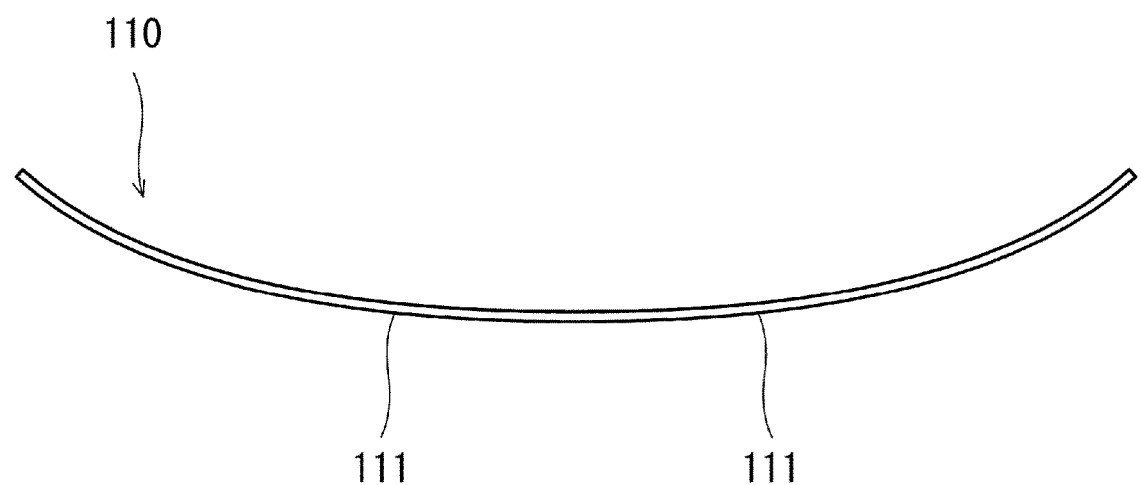

[FIG. 4]
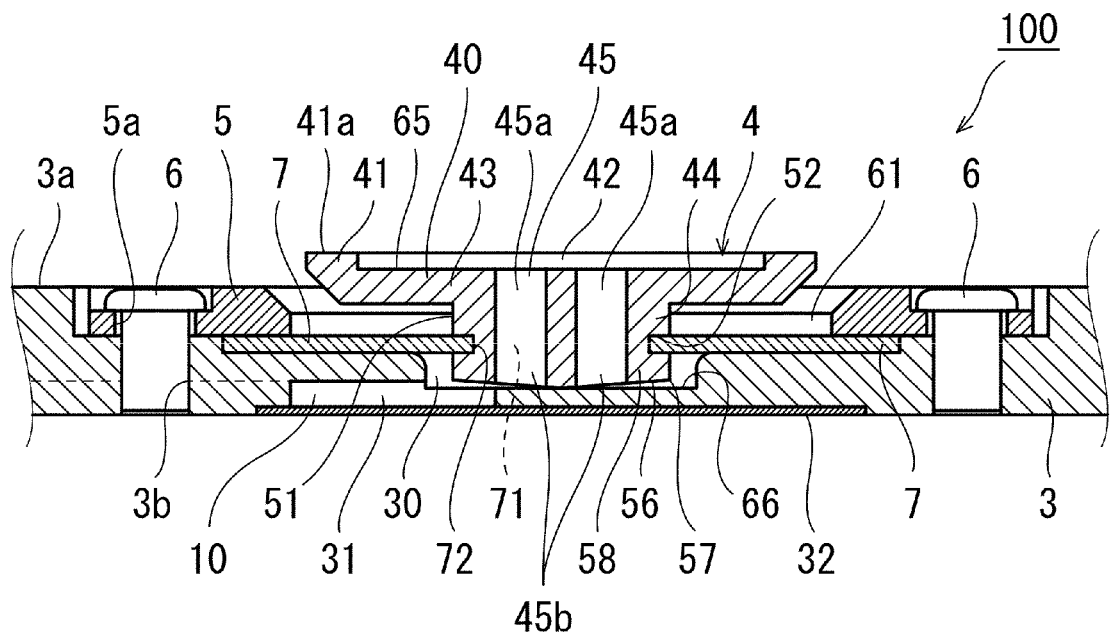
[FIG. 5]
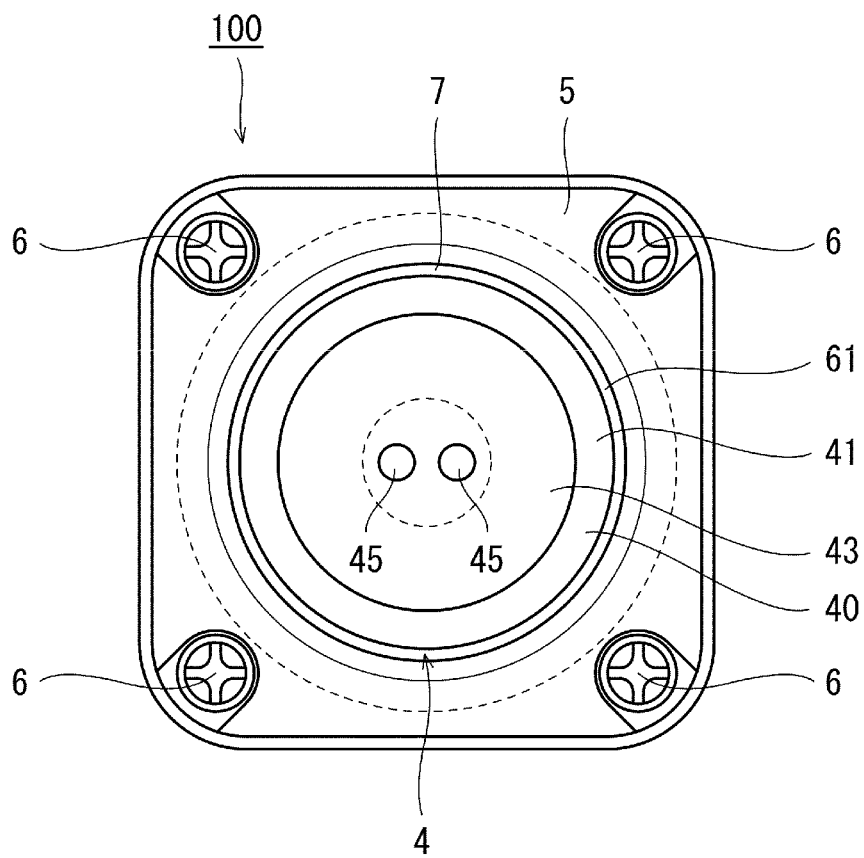

[FIG. 6]
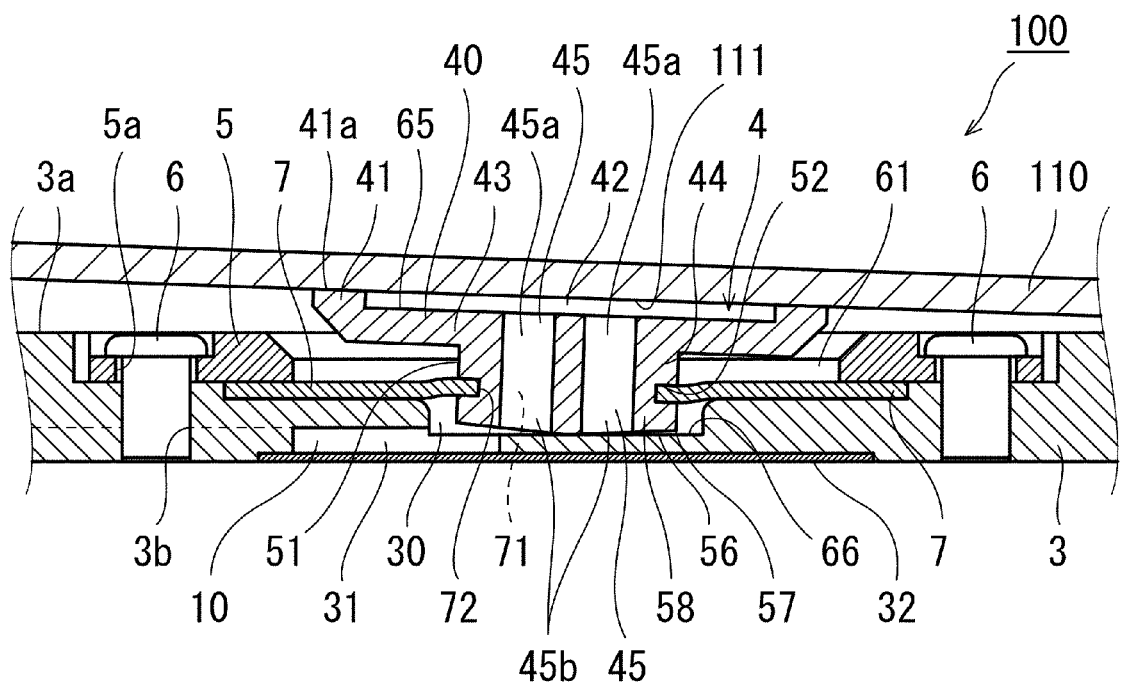
[FIG. 7]
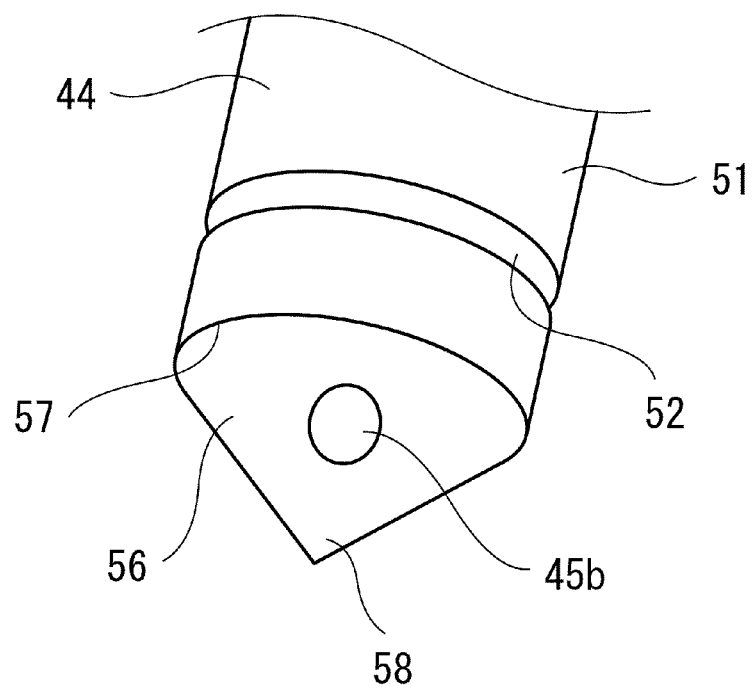

[FIG. 8]
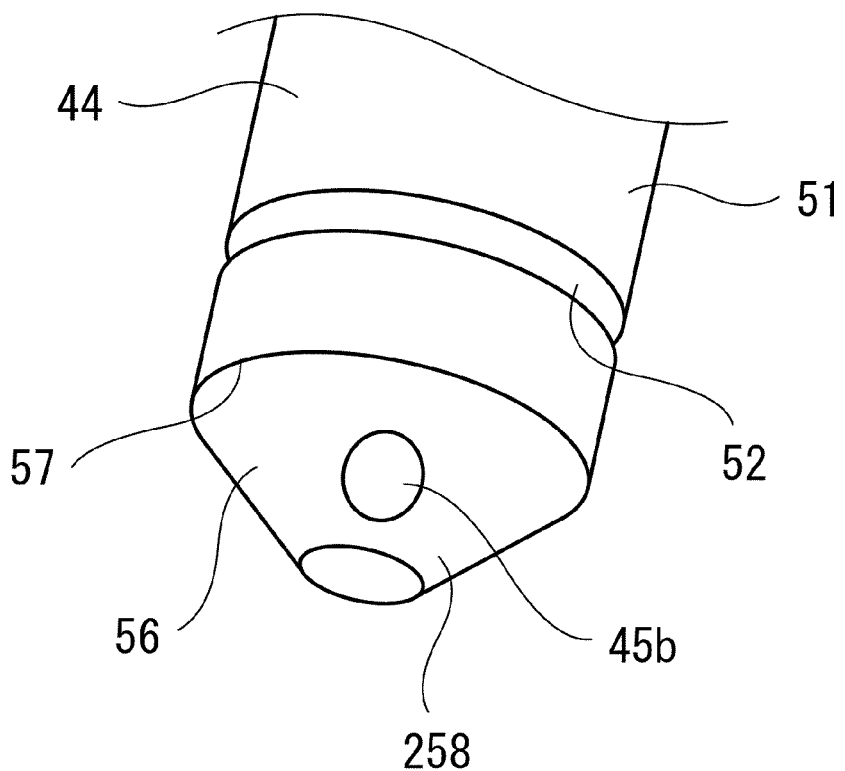
[FIG. 9]
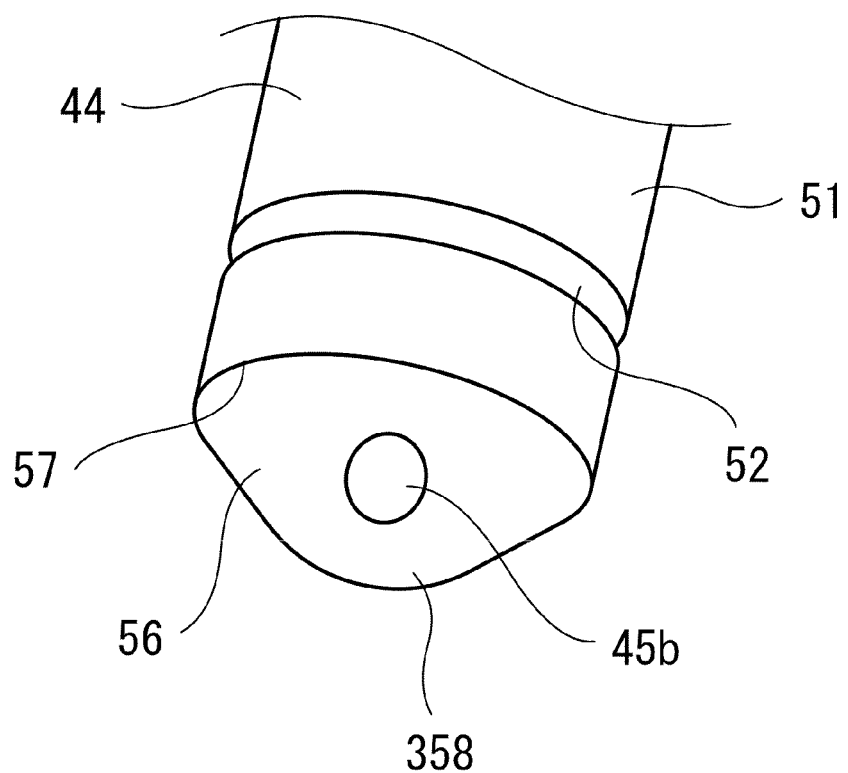

[FIG 10]
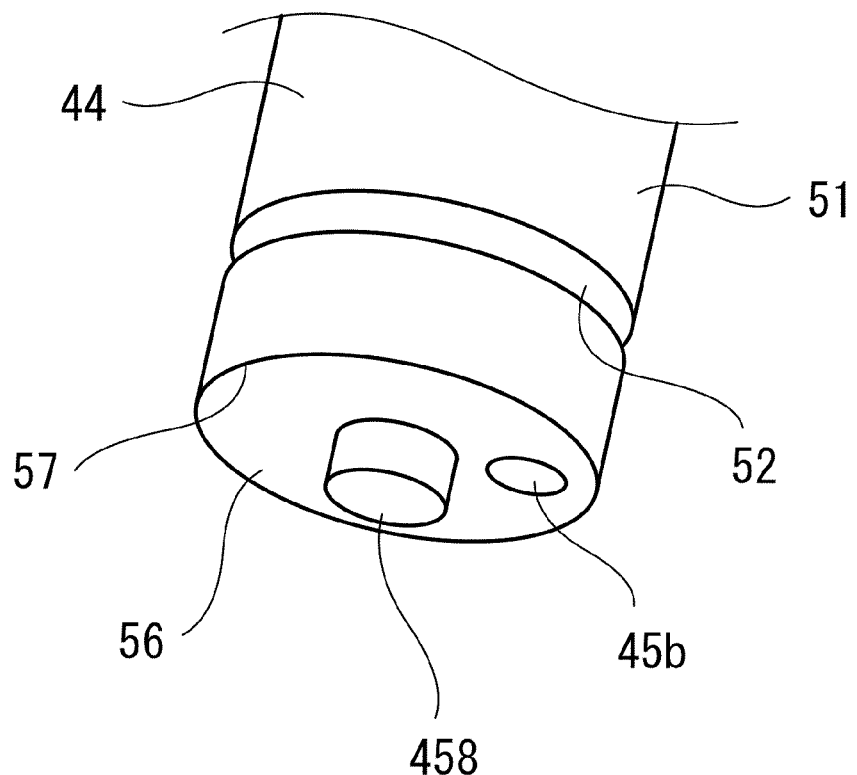
[FIG 11]
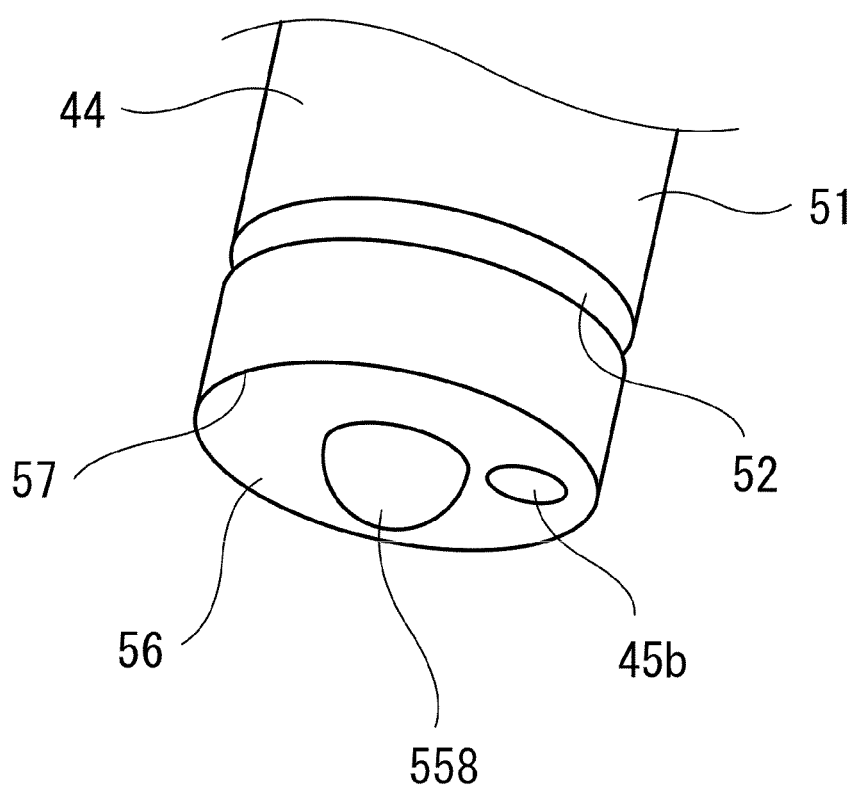

[FIG 12]
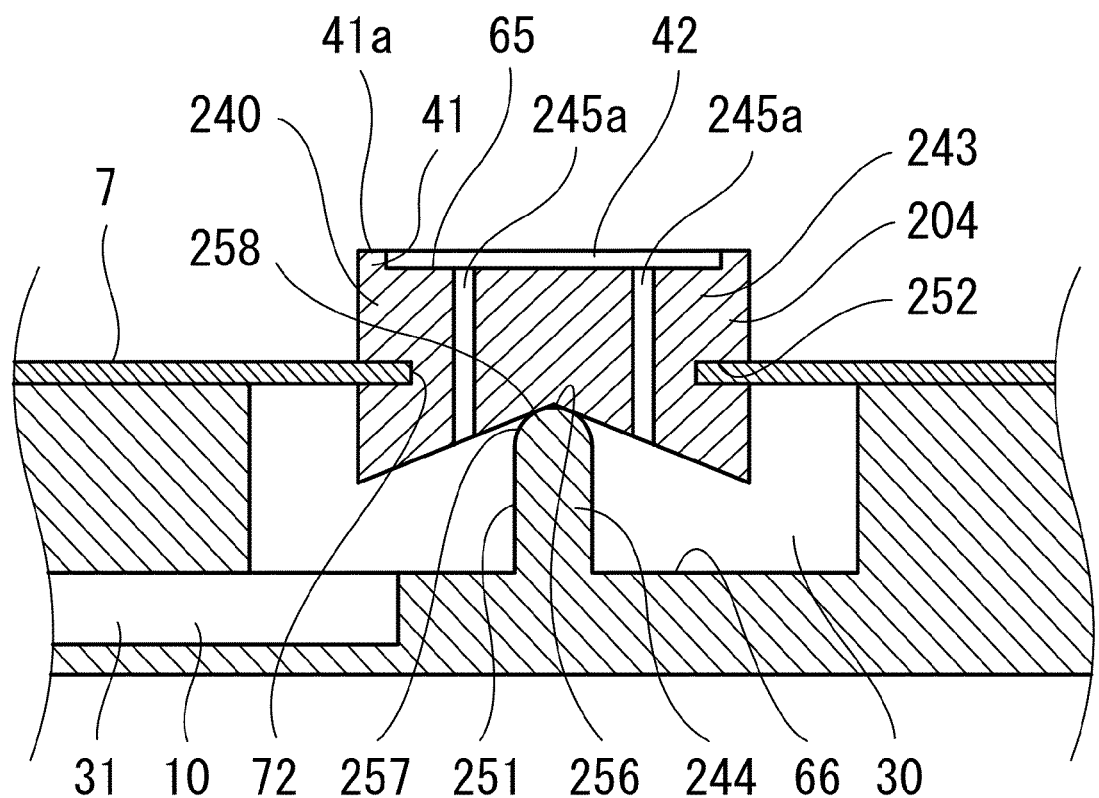

SUBSTRATE SUCTION-HOLDING STRUCTURE AND SUBSTRATE TRANSFER ROBOT

TECHNICAL FIELD

The present invention relates to a substrate suction-holding structure and a substrate transfer robot.

BACKGROUND ART

Conventionally, a substrate suction-holding structure for sucking and holding a substrate such as a wafer has been known. For example, a suction-holding apparatus disclosed in JP 2004-186355 A includes a suction-holding member that vacuum-sucks a wafer to be held. The suction-holding member is provided with a contact portion that contacts the wafer, and a vacuum conduit is opened inside the contact portion. This enables the wafer to be held by means of vacuum suction. Also, the upper surfaces of the contact portion and the suction-holding member are coated with an electrostatic diffusion film, and charging of the wafer and the suction-holding member can thus be prevented.

SUMMARY OF INVENTION

However, there is a case in which the wafer is warped, and in which, even when such a warped wafer is to be vacuum-sucked with use of the suction-holding apparatus disclosed in JP 2004-186355 A, the wafer cannot be vacuum-sucked due to a gap between the suction-holding member and the wafer.

To solve the above problem, a substrate suction-holding structure includes a pad main body including an annular contact portion and a bottom wall portion closing a bottom surface of a first vacuum chamber surrounded by the contact portion, the pad main body being conductive, a blade main body including an upper surface and a second vacuum chamber formed by depressing the upper surface, the blade main body being conductive, a support column provided either on the second vacuum chamber or on the pad main body, causing the contact portion of the pad main body to be located further on an upper side than the upper surface of the blade main body above the second vacuum chamber, and swingably supporting the pad main body with respect to the second vacuum chamber, the support column being conductive, a cover secured to the blade main body and covering the second vacuum chamber, and a suction path extending from the first vacuum chamber and passing through the bottom wall portion of the pad main body, the second vacuum chamber, and the blade main body in this order, the suction path being connected to a vacuum source.

According to this configuration, when a warped substrate is placed on the pad, the pad swings, and the contact portion can fit in a lower surface of the substrate. Accordingly, the warped substrate can reliably be held, and the transfer efficiency of the warped substrate can be improved. Also, static electricity of the substrate can be diffused when the warped substrate is transferred, particles can be prevented from being attached to the substrate, and a yield in a procedure of processing the substrate can be improved.

The above object, other objects, features, and advantages of the present invention will become apparent from the following detailed description of the preferred embodiments with reference to the accompanying drawings.

BRIEF DESCRIPTION OF DRAWINGS

FIG. 1 is a plan view illustrating a configuration example of a blade provided with a substrate suction-holding structure according to Embodiment 1.

FIG. 2 is a side view illustrating a configuration example of a substrate transfer robot including the blade in FIG. 1.

FIG. 3 is a cross-sectional view illustrating an example of a warped wafer.

FIG. 4 is a cross-sectional view illustrating a configuration example of the substrate suction-holding structure in FIG. 1.

FIG. 5 is a plan view illustrating the configuration example of the substrate suction-holding structure in FIG. 1.

FIG. 6 is a cross-sectional view illustrating a state in which the substrate suction-holding structure in FIG. 1 holds a substrate.

FIG. 7 is a bottom perspective view illustrating a configuration example of a support column of a pad of the substrate suction-holding structure in FIG. 1.

FIG. 8 is a bottom perspective view illustrating a modification example of the support column of the pad of the substrate suction-holding structure according to Embodiment 1.

FIG. 9 is a bottom perspective view illustrating a modification example of the support column of the pad of the substrate suction-holding structure according to Embodiment 1.

FIG. 10 is a bottom perspective view illustrating a modification example of the support column of the pad of the substrate suction-holding structure according to Embodiment 1.

FIG. 11 is a bottom perspective view illustrating a modification example of the support column of the pad of the substrate suction-holding structure according to Embodiment 1.

FIG. 12 is a cross-sectional view illustrating a configuration example of a substrate suction-holding structure according to Embodiment 2.

DESCRIPTION OF EMBODIMENTS

Hereinbelow, embodiments will be described with reference to the drawings. Note that the present invention is not limited by the present embodiments. Also, in the following description, identical or corresponding components are labeled with the same reference signs throughout the drawings, and description of the duplicate components is omitted.

Embodiment 1

FIG. 1 is a plan view illustrating a configuration example of a blade 9 provided with a substrate suction-holding structure 100 according to Embodiment 1. FIG. 2 is a side view illustrating a configuration example of a substrate transfer robot 1 including the blade 9.

As illustrated in FIGS. 1 and 2, the substrate suction-holding structure 100 is a structure that holds a substrate 110 provided on the blade 9 of the substrate transfer robot 1. The blade 9 is provided at a tip end portion of a robot arm 2, and the blade 9 and the robot arm 2 are electrically connected. The blade 9 provided with the substrate suction-holding structure 100 constitutes a so-called vacuum-type hand that sucks and holds the substrate 110 and transfers the held substrate 110. In particular, the blade 9 has a structure enabling a bowed wafer called a bow wafer illustrated in FIG. 3, for example, to be sucked and held. Such a warped wafer has a pad contact region 111 on a lower surface thereof, which is in contact with a support portion (pad 4) of the hand, inclined. Also, the warped wafer may be warped in various forms such as a bowl shape, a dome shape, and a curl shape, and the inclination angle and the inclination direction in the pad contact region 111 are not constant.

For example, the substrate transfer robot 1 moves the robot arm 2 to place one of a plurality of substrates 110 housed in a carrier called a front opening unified pod (FOUP) on the blade 9. In FIG. 1, the substrate 110 is a wafer, but is not limited to this, and may be a glass substrate. The substrate transfer robot 1 then moves the robot arm 2 to take the substrate out of the carrier and transfer the substrate to a predetermined position. The substrate transfer robot 1 is, for example, a scalar-type horizontal articulated robot, and the blade 9 is moved by the robot arm 2 of the substrate transfer robot 1 three-dimensionally, that is, in triaxial directions perpendicular to each other.

The plurality of (for example, three) substrate suction-holding structures 100 are provided to be arranged in a peripheral direction around a center C of the substrate 110 held by the blade 9. As a result, the substrate 110 held by the blade 9 is supported at a plurality of points by the substrate suction-holding structure 100 and is held more reliably. The substrate suction-holding structure 100 includes a second vacuum chamber 30 provided in a blade main body 3 of the blade 9, a pad 4, a cover 7 (pad body support), a securing frame 5, a fastener 6, a suction path 10, and a vacuum source 8.

The blade main body 3 is formed in a thin plate shape extending in a horizontal direction, and an upper surface thereof is basically formed by a flat surface 3a. The blade main body 3 holds the substrate 110 via the pad 4. The blade main body 3 is made of a conductive material such as aluminum. Alternatively, the blade main body 3 may be made conductive by applying a surface treatment such as plating to an insulating ceramic such as alumina. In a portion of the blade main body 3 in which the substrate suction-holding structure 100 is to be provided, a three-step stair-like depression is formed.

The pad 4 has a function of contacting the substrate 110 and directly supporting the substrate 110. The pad 4 forms a part of a suction path and an electric path extending from the substrate 110 toward the blade main body 3. The pad 4 contains a conductive material and is entirely made of conductive poly ether ether ketone (PEEK) resin, for example. Specifically, the pad 4 is made of PEEK resin containing carbon. The PEEK resin is a non-elastomer excellent in heat resistance and mechanical strength. Accordingly, generation of particles can be suppressed, and a yield in a procedure of processing the substrate 110 can be improved. Note that the pad 4 may be made of a non-conductive material subjected to a surface treatment such as plating to be made conductive.

The pad 4 includes a pad main body 40 and a support column 44. The pad main body 40 has an annular contact portion 41 extending in the horizontal direction. A top (upper surface) of the contact portion 41 is a substrate support surface 41a that contacts a lower surface of the substrate 110. A region surrounded by the contact portion 41 forms a first vacuum chamber 42. A bottom wall portion 43 is continuously provided at a lower edge of the contact portion 41, and a bottom surface 65 of the first vacuum chamber 42 is closed by the bottom wall portion 43. That is, the pad main body 40 has a shallow dish shape as a whole and is provided inside with the first vacuum chamber 42, which is a space opened upward.

A columnar support column 44 extends downward from a lower surface of the bottom wall portion 43. A cylindrical outer peripheral surface 51 of the support column 44 has a shorter diameter than the diameter of the contact portion 41 (for example, approximately ½ diameter) and extends downward from the lower surface of the bottom wall portion 43. The outer peripheral surface 51 is provided at an intermediate portion thereof in a vertical direction with an annular concave groove 52 extending in a peripheral direction of the outer peripheral surface 51. An outer peripheral edge 57 of a bottom surface 56 of the support column 44 is continuous with a lower edge of the outer peripheral surface 51.

The bottom surface 56 of the support column 44 is provided with a projection 58. The projection 58 is formed in a shape of projecting downward from the outer peripheral edge 57 toward the inside (the center axis of the support column 44). Specifically, as illustrated in FIGS. 4 and 7, the projection 58 is formed in a conical shape. However, alternatively, the projection 58 may be in a truncated conical shape (refer to FIG. 8) or a dome shape (refer to FIG. 9). Further, the projection 58 may be formed in a shape in which a part of a region inside the outer peripheral edge 57 projects. Specifically, the projection 58 may be in a columnar shape (refer to FIG. 10) or a hemispherical shape (refer to FIG. 11) that forms a step between the projection 58 and the outer peripheral edge 57. In this manner, the bottom surface 56 has a part of the inside region thereof project further downward than a part of an outside region surrounding the inner region on the outside of the inside region. The contact portion 41, the bottom wall portion 43, and the support column 44 constitute a pad body. Also, a top of the projection 58 may be located on the center axis of the support column 44.

An in-pad flow path 45 penetrating the bottom wall portion 43 and the support column 44 is formed. The in-pad flow path 45 is a through hole extending in parallel with the center axis of the support column 44 and passing through the inside of the pad 4, and an upper end thereof is opened to an upper surface of the pad 4. Specifically, the in-pad flow path 45 is a conduit including an in-pad-main-body flow path 45a formed in the pad main body 40 and an in-support-column flow path 45b formed in the support column 44. An upper end of the in-pad-main-body flow path 45a is opened to the bottom surface 65 of the first vacuum chamber 42 and is continuous with the first vacuum chamber 42. The in-pad-main-body flow path 45a extends downward and penetrates the bottom wall portion 43. An upper end of the in-support-column flow path 45b is continuous with a lower end of the in-pad-main-body flow path 45a, and the in-support-column flow path 45b penetrates the support column 44. A lower end of the in-support-column flow path 45b is opened to the bottom surface 56 of the support column 44. In the present embodiment, the two in-pad flow paths 45 are formed eccentrically with respect to the center axis of the support column 44 and are formed on lateral sides of the top of the projection 58.

The second vacuum chamber 30 is formed at a portion corresponding to a bottom of the depression provided on the upper surface of the blade main body 3. Specifically, a depression on the lowermost step (the third step from the top) of the three-step stair-like depression is the second vacuum chamber 30. The second vacuum chamber 30 houses a lower end of the support column 44 of the pad 4 at which a lower end of the in-pad flow path 45 is opened, which causes the in-pad flow path 45 to be connected to the second vacuum chamber 30. Also, a bottom surface 66 of the second vacuum chamber 30 is flat, and the projection 58 of the pad 4 is placed on the bottom surface 66. Accordingly, the pad 4 can take a posture of erecting on the bottom surface 66, that is, a reference posture (refer to FIG. 4), in which the substrate support surface 41a is located on a horizontal plane. Also, the pad 4 can swing from the reference posture in a radial direction D1, centering on the center C of the substrate suction-holding structure 100, and in a direction D2 (refer to FIG. 1) perpendicular to the radial direction D1, to a posture in which the pad 4 is inclined, that is, an inclined posture (refer to FIG. 6), in which the substrate support surface 41a is inclined with respect to the horizontal plane. In this manner, the support column 44 swingably supports the pad main body 40 with respect to the second vacuum chamber 30 with a portion at which the bottom surface 66 of the second vacuum chamber 30 and the bottom surface 56 of the support column 44 contact serving as a swing center.

Also, since the projection 58 is placed on the bottom surface 66, the bottom surface 66 of the second vacuum chamber 30 and the bottom surface 56 of the support column 44 come into contact with each other and are electrically connected via the contact portion between the projection 58 and the bottom surface 66 of the second vacuum chamber 30. Consequently, the configuration of the electric path connecting the pad 4 to the blade main body 3 can be simplified.

A height dimension of the pad 4, that is, a height dimension from the upper end of the contact portion 41 to the lower end of the support column 44, is formed to be longer than a depth dimension from the flat surface 3a of the upper surface of the blade main body 3 to the bottom surface 66 of the second vacuum chamber 30. The aforementioned depth dimension and height dimension are defined so that the substrate support surface 41a of the pad 4 may be located further on the upper side than the flat surface 3a of the blade main body 3 both in the reference posture and in the inclined posture and so that the substrate support surface 41a of the pad 4 may not sink into the depression of the blade main body 3. In this manner, the support column 44 causes the contact portion 41 of the pad main body 40 to be located further on the upper side than the upper surface (flat surface 3a) of the blade main body 3 above the second vacuum chamber 30 to support the pad main body 40 at one point.

The blade main body 3 is provided with an in-blade-main-body flow path 31. The in-blade-main-body flow path 31 is a conduit having one end thereof opened to and communicate into the second vacuum chamber 30. In the present embodiment, the in-blade-main-body flow path 31 is a thin groove formed on the bottom surface of the blade main body 3 and extends from the second vacuum chamber 30 to a base end of the blade main body 3. A back cover 32 that covers the bottom surface of the blade main body 3 is attached to the blade main body 3 to cause the in-blade-main-body flow path 31 to be covered on the bottom surface side of the blade main body 3 and form a conduit passing through the inside of the blade main body 3.

The cover 7 is a thin plate-like elastomer extending in the horizontal direction and has elasticity. The cover 7 has an insertion hole 71 formed at a center thereof. The support column 44 is inserted through the insertion hole 71. The cover 7 is fitted in a depression on a step higher by one step than the depression forming the second vacuum chamber 30 (the second step from the top) in the aforementioned stair-like depression of the blade main body 3, an outer peripheral edge of the cover 7 is located outside the second vacuum chamber 30 in a planar view, and a lower surface of the cover 7 contacts the upper surface of the blade main body 3.

In this manner, the cover 7 is arranged to cover the second vacuum chamber 30 and seals the second vacuum chamber 30. Also, an inner peripheral edge 72 forming the insertion hole 71 is fitted in the concave groove 52 of the support column 44. This enables the second vacuum chamber 30 to be sealed more reliably. In other words, the cover 7 supports the pad 4 at a position between the top surface and the bottom surface of the pad 4.

Note that the cover 7 may be made of a conductive material. In this case, the pad 4 and the blade main body 3 are further electrically connected via the cover 7. As a result, the inner peripheral edge 72 of the cover 7 comes into contact with the support column 44, and electric connection between the pad 4 and the blade main body 3 can be maintained even in a case in which a failure occurs in conduction in the electric path connecting the pad 4 to the blade main body 3 at the contact portion between the projection 58 and the bottom surface 66 of the second vacuum chamber 30.

The securing frame 5 is a plate-like frame and is formed in a shape of covering the outer peripheral edge 57 of the cover 7. Specifically, the securing frame 5 is formed in a quadrangular shape with rounded corners and has an inner hole 61 thereof larger than the pad 4 in a planar view formed at a center thereof. An inner peripheral edge of the securing frame 5 that forms the inner hole 61 is a portion that covers the outer peripheral edge 57 of the cover 7. Also, an outer peripheral edge of the securing frame 5 is fitted in and placed on a depression on a step higher by one step than the depression in which the cover 7 is fitted (the first step from the top) in the aforementioned depression of the blade main body 3. The outer peripheral edge of the securing frame 5 is located outside the outer peripheral edge of the cover 7 and inside the step between the flat surface 3a on the upper surface of the blade main body 3 and the depression in which the securing frame 5 is placed in a planar view. Accordingly, by dropping the securing frame 5 from the upper side of the depression of the blade main body 3 into the depression, the securing frame 5 can be fitted into the depression of the blade main body 3 without interfering with the pad 4. At four corners of the securing frame 5, through holes 5a for inserting the fasteners 6 are formed.

The fastener 6 is a fastener for removably fastening the securing frame 5 to the blade main body 3 and is a male screw, for example. The blade main body 3 is provided with a female screw hole 3b arranged to be coaxial with the through hole 5a of the securing frame 5 fitted in the depression of the blade main body 3, and the fastener 6 is screwed into the female screw hole 3b.

In this manner, by fastening the four corners of the securing frame 5 to the blade main body 3 by means of the fasteners 6, the outer peripheral edge of the cover 7 is pressed against the blade main body 3 from the upper side by the securing frame 5, and the cover 7 is secured to and arranged on the blade main body 3. Accordingly, the pad 4 is biased by the cover 7 from the swing posture to the reference posture and is held by the securing frame 5 to take the reference posture. Also, since the inner peripheral edge 72 of the cover 7 is in contact with the support column 44 having a smaller diameter than the pad main body 40, a portion from the outer peripheral edge to the inner peripheral edge 72 of the cover 7 in the radial direction of the pad main body 40 can be long, and the cover 7 can be deformed significantly. This enables the pad main body 40 to be inclined significantly.

In this state, the upper surface of the second vacuum chamber 30 interposed between the in-pad flow path 45 and the in-blade-main-body flow path 31 is closed by the cover 7, and the first vacuum chamber 42, the in-pad-main-body flow path 45a, the in-support-column flow path 45b, the second vacuum chamber 30, and the in-blade-main-body flow path 31 form the suction path 10, which is a continuous flow path. In other words, the suction path 10 extends from the first vacuum chamber 42 and passes through the bottom wall portion 43 of the pad main body 40, the support column 44, the second vacuum chamber 30, and the in-blade-main-body flow path 31 in this order. The suction path 10 is then connected to the vacuum source 8 via a conduit provided in the robot arm 2. The gas in the first vacuum chamber 42 can be sucked by means of a suction operation of the vacuum source 8. The suction path 10 is provided with an on-off valve, and the on-off valve opens the conduit to enable the gas in the first vacuum chamber 42 to be sucked. Also, the on-off valve closes the conduit to enable suction of the gas in the first vacuum chamber 42 to be stopped. The vacuum source 8 is, for example, a vacuum pump, and is arranged near or inside the substrate transfer robot 1.

Also, the pad 4 and the cover 7 can be detached by detaching the fastener 6 from the blade main body 3 and then detaching the securing frame 5 from the blade main body 3. Therefore, the pad 4 can be replaced easily.

In the substrate suction-holding structure 100 configured as above, as illustrated in FIG. 6, when the warped substrate 110 is placed on the substrate support surface 41a, the pad main body 40 is inclined from the reference posture illustrated in FIG. 4 to the inclined posture with the lower end of the projection 58 as a fulcrum, the substrate support surface 41a can fit in the pad contact region 111 on the lower surface of the substrate 110, and a gap can be prevented from being generated between the substrate support surface 41a and the pad contact region 111. As a result, the vacuum source 8 performs the suction operation to enable the warped substrate 110 to be sucked by the pad main body 40 reliably. As a result, even when the robot arm 2 is moved at high speed to transfer the substrate 110, and high acceleration acts on the held substrate 110, the substrate 110 can be prevented from being displaced. As a result, the transfer efficiency of the warped substrate 110 can be improved.

Also, as described above, the continuous electric path is formed from the substrate support surface 41a of the contact portion 41 to the robot arm 2, and, when the pad contact region 111 of the substrate 110 contacts the substrate support surface 41a, static electricity charged on the substrate 110 is diffused to the blade main body 3 through a contact portion between the bottom surface 56 of the support column 44 and the bottom surface 66 of the second vacuum chamber 30 and is further diffused to the robot arm 2. Accordingly, particles can be prevented from being attached at the time of transfer, and a yield can be improved.

Further, since the pad main body 40 is configured to be swingable in the radial direction D1, centering on the center C of the substrate suction-holding structure 100, and in the direction D2 perpendicular to the radial direction D1, the substrate 110 in which the warpage is not uniform can be held.

Also, in a case in which the warped substrate 110 is held with a so-called edge grip type hand that presses and holds the end of the substrate 110 with a holding member, the substrate 110 may further be warped, and the holding force may be reduced. However, since the substrate suction-holding structure 100 sucks and holds the substrate 110, the warped substrate 110 can be held more reliably.

Embodiment 2

Hereinbelow, a configuration of Embodiment 2 will be described, focusing on differences from Embodiment 1.

FIG. 12 is a cross-sectional view illustrating a configuration example of a substrate suction-holding structure according to Embodiment 2.

In Embodiment 1 described above, the support column 44 is provided on the pad main body 40. On the other hand, in the present embodiment, a support column 244 is provided in the second vacuum chamber 30 as illustrated in FIG. 12. Specifically, the support column 244 has a lower end thereof secured to the second vacuum chamber 30. The support column 244 has an outer peripheral surface 251 extending upward from the bottom surface 66 of the second vacuum chamber 30 and an upper surface 256 including an outer peripheral edge 257 connected to the outer peripheral surface 251. The upper surface 256 is provided with a projection 258 projecting upward from the outer peripheral edge 257 toward the inside or projecting upward at a part of a region inside the outer peripheral edge 257.

A bottom wall portion 243 of a pad main body 240 has a bottom surface thereof depressed upward from the outer peripheral edge toward the center. The center of the bottom surface of the bottom wall portion 243 is placed on the projection 258 of the support column 244, and the support column 244 supports the pad main body 240. As a result, the pad body 240 is swingably supported between the reference posture and the inclined posture as in Embodiment 1 described above. In this manner, the support column 244 causes the contact portion 41 of the pad main body 240 to be located further on the upper side than the upper surface (flat surface 3a) of the blade main body 3 above the second vacuum chamber 30 to support the pad main body 240 at one point.

Also, an in-pad-main-body flow path 245a is opened to a bottom surface of the bottom wall portion 243 and is connected to the second vacuum chamber 30 at this opening. The in-pad-main-body flow path 245a connected to the first vacuum chamber 42, the second vacuum chamber 30, and the in-blade-main-body flow path 31 form a suction path 210. In other words, the suction path 210 extends from the first vacuum chamber 42 and passes through the bottom wall portion 243 of the pad main body 240, the second vacuum chamber 30, and the blade main body 3 in this order. The suction path 210 is then connected to the vacuum source 8 via a conduit provided in the robot arm 2.

A concave groove 252 is formed at an intermediate portion of an outer peripheral surface of the pad main body 240 in a vertical direction. The inner peripheral edge 72 of the cover 7 is fitted in the concave groove 252, and the cover 7 biases the pad main body 240 from the swing posture to the reference posture and holds the pad main body 240 so that the pad main body 240 may take the reference posture.

From the above description, many modifications of the present embodiments and other embodiments are obvious to those skilled in the art. Accordingly, the foregoing description should be construed as being illustrative only and is provided for the purpose of teaching those skilled in the art the best mode for carrying out the present invention. The details of the structure and/or function of the present invention can substantially be changed without departing from the spirit of the present invention.

The invention claimed is:

1. A substrate suction-holding structure comprising:
   a pad main body including an annular contact portion and a bottom wall portion closing a bottom surface of a first vacuum chamber surrounded by the contact portion, the pad main body being conductive;

a blade main body including an upper surface and a second vacuum chamber formed by depressing the upper surface, the blade main body being conductive;

a support column provided either on the second vacuum chamber or on the pad main body, causing the contact portion of the pad main body to be located further on an upper side than the upper surface of the blade main body above the second vacuum chamber, and swingably supporting the pad main body with respect to the second vacuum chamber, the support column being conductive;

a cover secured to the blade main body and covering the second vacuum chamber;

a suction path extending from the first vacuum chamber and passing through the bottom wall portion of the pad main body, the second vacuum chamber, and the blade main body in this order, the suction path being connected to a vacuum source; and an electric path directly connecting the pad main body to the blade main body.

2. The substrate suction-holding structure according to claim 1, wherein the support column supports the pad main body at one point.

3. The substrate suction-holding structure according to claim 1,
wherein the support column includes an outer peripheral surface provided at the pad main body and extending downward from a lower surface of the bottom wall portion and a bottom surface including an outer peripheral edge connected to the outer peripheral surface and a projection projecting downward from the outer peripheral edge toward an inside or projecting downward at a part of a region inside the outer peripheral edge, and
wherein the second vacuum chamber includes a bottom surface housing a lower end of the support column and having the projection placed thereon.

4. The substrate suction-holding structure according to claim 3, wherein the suction path includes an in-pad-main-body flow path penetrating the bottom wall portion, an in-support-column flow path having a first end thereof continuous with the in-pad-main-body flow path, penetrating the support column, and having a second end thereof opened to the bottom surface of the support column, the second vacuum chamber connected to the second end of the in-support-column flow path, and an in-blade flow path formed in the blade main body, having a first end portion thereof connected to the second vacuum chamber, and having a second end portion thereof connected to the vacuum source.

5. The substrate suction-holding structure according to claim 3, wherein the projection is formed in a conical shape, in a truncated conical shape, in a hemispherical shape, in a dome shape, or in a columnar shape forming a step between the projection and the outer peripheral edge.

6. The substrate suction-holding structure according to claim 3, wherein the support column and the blade main body are electrically connected via the projection.

7. The substrate suction-holding structure according to claim 1,
wherein the second vacuum chamber includes a bottom surface, and
wherein the support column includes an outer peripheral surface provided at the second vacuum chamber and extending upward from the lower surface of the second vacuum chamber and an upper surface including an outer peripheral edge connected to the outer peripheral surface and a projection projecting upward from the outer peripheral edge toward an inside or projecting upward at a part of a region inside the outer peripheral edge.

8. The substrate suction-holding structure according to claim 7, wherein the projection is formed in a conical shape, in a truncated conical shape, in a hemispherical shape, in a dome shape, or in a columnar shape forming a step between the projection and the outer peripheral edge.

9. The substrate suction-holding structure according to claim 1, wherein a material for the pad main body is conductive PEEK resin.

10. The substrate suction-holding structure according to claim 1, wherein the cover is a conductive elastic body and includes an insertion hole through which the support column is inserted, and an inner peripheral edge forming the insertion hole contacts the support column or the pad main body.

11. The substrate suction-holding structure according to claim 1, comprising:
a securing frame formed in a shape of covering an outer peripheral edge of the cover; and
a fastener removably fastening the securing frame to the blade main body.

12. A substrate transfer robot comprising a blade having a plurality of substrate suction-holding structures each of which is the substrate suction-holding structure according to claim 1 arranged in a peripheral direction around a center of a substrate held by the blade main body.

13. The substrate transfer robot according to claim 12, further comprising a robot arm provided at a tip end portion thereof with the blade,
wherein the electric path is continuous from the contact portion to the robot arm.

14. A substrate suction-holding structure comprising:
a pad body;
a pad body support;
a blade main body; and
a suction path,
wherein the pad body
is placed on the blade main body,
includes a bottom surface, the bottom surface having a part of an inside region thereof project further downward than a part of an outside region outside the inner region, and
is capable of being inclined with respect to the blade main body,
wherein the pad body support
is secured to the blade main body, and
supports the pad body at a position between an upper surface and the bottom surface of the pad body,
wherein the suction path includes
an in-pad flow path passing through an inside of the pad body and opened at the upper surface of the pad body, and
an in-blade flow path passing through an inside of the blade main body, having a first end portion thereof connected to the in-pad flow path, and a second end portion thereof connected to a vacuum source, and
wherein the substrate suction-holding structure further comprises an electric path directly connecting the pad body to the blade main body.

* * * * *